(12) United States Patent  (10) Patent No.: US 7,215,165 B2
Yamamoto et al.  (45) Date of Patent: May 8, 2007

(54) CLOCK GENERATING CIRCUIT AND CLOCK GENERATING METHOD

(75) Inventors: Shinichi Yamamoto, Kasugai (JP); Koji Okada, Kasugai (JP); Masahiro Tanaka, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 11/267,152

(22) Filed: Nov. 7, 2005

(65) Prior Publication Data

US 2006/0290393 A1  Dec. 28, 2006

(30) Foreign Application Priority Data

Jun. 23, 2005  (JP) .............................. 2005-183645

(51) Int. Cl.
*H03L 7/06* (2006.01)
(52) U.S. Cl. ....................................... 327/156; 327/161
(58) Field of Classification Search ........ 327/147–149, 327/153–158, 161; 331/17, 25, 1 A, DIG. 2; 375/373–376
See application file for complete search history.

(56) References Cited

U.S. PATENT DOCUMENTS 6,160,456 A  12/2000  Chang ........................ 331/1 A
7,079,616 B2 *  7/2006  Castiglione et al. ........ 375/376
2004/0001600 A1  1/2004  Kim et al. ................... 381/100
2004/0257124 A1  12/2004  Araki et al. ................ 327/101

FOREIGN PATENT DOCUMENTS

EP  1 398 879 A1  3/2004
JP  2005-020083 A  1/2005

* cited by examiner

*Primary Examiner*—Linh My Nguyen
(74) *Attorney, Agent, or Firm*—Arent Fox LLP

(57) ABSTRACT

The invention provides a clock generating circuit for generating a spectrum spread clock and carrying out high-speed and accurate phase control of a reference clock signal and an output clock signal, which is composed of compact circuits, and a method for generating the clock. The spectrum spread clock generating circuit 1 is provided with a phase comparator unit 10 that compares the reference clock signal CLKS with the internal clock signal in terms of a phase difference, and outputs a control current IC1 in compliance with the result of comparison; a clock generating unit 20 for generating an output clock signal CLKO; a phase difference signal modulating unit 30 for outputting a control current IC3; and a delay unit 40 for delaying the output clock in compliance with the control current IC3 and outputting the internal clock signal CLKN.

13 Claims, 11 Drawing Sheets

CIRCUIT BLOCK DIAGRAM DEPICTING CONFIGURATION OF PRESENT EMBODIMENT

FIG.1 CIRCUIT BLOCK DIAGRAM DEPICTING CONFIGURATION OF PRESENT EMBODIMENT

FIG.2 CIRCUIT DIAGRAM DEPICTING DETAILED EXAMPLE OF CLOCK GENERATING UNIT

FIG.3 CIRCUIT DIAGRAM DEPICTING DETAILED EXAMPLE OF PHASE DIFFERENCE SIGNAL MODULATING UNIT

FIG.4 CIRCUIT DIAGRAM DEPICTING DETAILED EXAMPLE OF DELAY UNIT

WAVEFORM DIAGRAM DEPICTING RELATIONSHIP BETWEEN CLKO AND CLKN IN STEPS S1 THROUGH S8

WAVEFORM DIAGRAM DEPICTING RELATIONSHIP BETWEEN CLKO AND CLKN IN STEPS S9 THROUGH S16

WAVEFORM DIAGRAM DEPICTING RELATIONSHIP BETWEEN CLKR AND CLKO IN STEPS S1 THROUGH S8

WAVEFORM DIAGRAM DEPICTING RELATIONSHIP BETWEEN CLKR AND CLKO IN STEPS S9 THROUGH S16

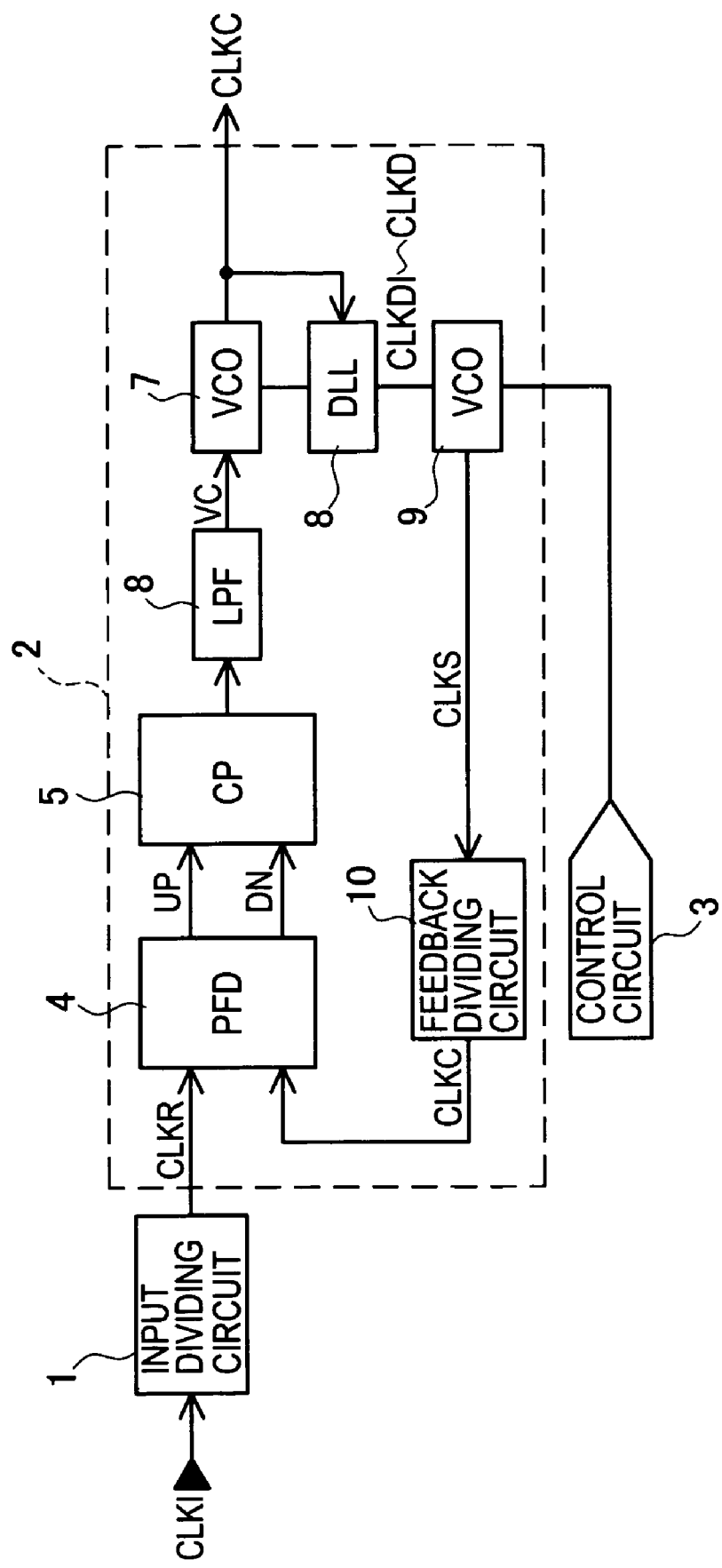
FIG.11 CIRCUIT BLOCK DIAGRAM DEPICTING PRIOR ART

CLOCK GENERATING CIRCUIT AND CLOCK GENERATING METHOD

CROSS-REFERENCE TO RELATED APPLICATIONS

This application is based upon and claims the benefit of priority from each of the prior Japanese Patent Application No. 2005-183645 filed on Jun. 23, 2005, the entire contents of which are incorporated herein by reference.

BACKGROUND OF THE INVENTION

1. Field of the Invention

The present invention relates to a clock generating circuit, and in particular, to a clock generating circuit for modulating a frequency for spectrum spread by controlling the phase difference between a reference clock and an output clock at high accuracy, and a method for controlling the same.

2. Description of the Related Art

In recent years, a spectrum spread clock generator (hereinafter also called an "SSCG") has been spotlighted, which reduces EMI (Electro Magnetic Interference) noise. The SSCG is provided with a PLL circuit and spreads a frequency spectrum of an output clock signal by locking the frequency for the reference clock with respect to the output clock signal and modulating the frequency.

Since an efficient countermeasure can be taken for the EMI noise if the SSCG is utilized, it is highly demanded that utilization of the SSCG is enabled even for devices for which it has been difficult to utilize the SSCG before.

As an example, a case where the SSCG is utilized for a synchronous interface which carries out data transfer between two flip-flops in synchronization with a clock signal is taken into consideration. In this case, it is assumed that a system clock signal (reference clock signal in the SSCG) is connected to the clock end of the output side flip-flop, and an output clock signal of the SSCG is connected to the clock end of the input side flip-flop. A phase difference between the system clock signal and the SSCG output clock signal changes from time to time due to modulation of the SSCG frequency. Therefore, if the phase difference exceeds one cycle, such a situation occurs, in which data outputted from the output side flip-flop are not taken into the input side flip-flop. Accordingly, in a case where the SSCG is thus utilized in the synchronous interface, it is necessary that the modulation of frequency of the SSCG is controlled so that the phase difference of respective clock signals does not exceed the length of one cycle of the system clock signal. That is, it is required that the frequency modulation is controlled with the phase difference of the reference clock and output clock signals kept at high accuracy with respect to the SSCG.

A clock generating circuit disclosed by Japanese Unexamined Patent Publication No. 2005-20083 has been proposed to meet such a demand. The clock generating circuit according to Japanese Unexamined Patent Publication No. 2005-20083 is provided, as depicted in FIG. 11, with a delay element that delays an oscillation clock signal (hereinafter also called an "output clock signal") and generates a plurality of delay clock signals the respective phases of which differ from each other, and a selector circuit for selecting one of the plurality of delay clock signals and outputting an internal clock. In the selector circuit, frequency modulation is carried out for spectrum spread by switching the delay clock signal.

Also, in the clock generating circuit, a range of fluctuations in delay time in the delay element is controlled so as to be accommodated in one cycle of the output clock signal. Therefore, it is possible to carry out frequency modulation by controlling the phase difference between the reference clock signal and output clock signal at high accuracy.

SUMMARY OF THE INVENTION

However, in the clock generating circuit according to Japanese Unexamined Patent Publication No. 2005-20083, the delay time of the delay element is adjusted based on an output clock signal. That is, a delay time equivalent to the length of one cycle of the output clock signal is generated in the delay element, and the delay time and the time of one cycle of the output clock signal are compared with each other, wherein the delay time is adjusted in response to the result of comparison. In the clock generating circuit according to Japanese Unexamined Patent Publication No. 2005-20083, since a DDL (Delay Lock Loop) is utilized for the comparison, the circuit is complicated, resulting in an increase in the circuit configuration.

In addition, since the fluctuation range of the delay time in the delay element is adjusted by feedback control of the DLL, a delay in response to frequency fluctuations of the output clock signal occurs. For example, it is assumed that the delay clock signal which is delayed to the maximum is selected in the selector circuit, that is, a delay clock signal whose delay time has a length of one cycle of the output clock signal is selected therein. In this case, if a fluctuation occurs in the direction along which the cycle of the output clock signal is shortened, the delay time of the delay clock exceeds one cycle of the output clock in the range from this time to a response of the DLL. Where the clock generating circuit according to Japanese Unexamined Patent Publication No. 2005-20083 is utilized for the above-described synchronous interface, such a problem occurs, by which there is a risk that data transmission is not securely carried out.

The invention was developed in order to solve at least one of the problems in the background art, and it is therefore an object of the invention to provide a clock generating circuit, composed of compact circuits, which generates a spectrum spread clock and carries out accurate phase control of a reference clock signal and an output clock signal, and a method for generating clocks.

To achieve the object above, there is provided a clock generating circuit which uses a reference clock as an input and carries out spectrum spread of an output clock in compliance with modulation signals, comprising a phase comparator unit for comparing a phase difference between the reference clock and an internal clock or the divided internal clock, and outputting a phase difference signal in response to the result of comparison, a clock generating unit for generating an output clock in response to the phase difference signal, a phase difference signal modulating unit for modulating the phase difference signal in compliance with the modulating signal, and for outputting a phase difference modulating signal, and a delay unit for delaying the output clock in compliance with the phase difference modulating signal; and for outputting the internal clock.

In the clock generating circuit according to the invention, an output clock signal is delayed on the basis of a phase difference signal. Therefore, in comparison with a case where a fluctuation of the cycle of the output clock signal is detected, it is possible to detect fluctuations in the frequency and cycle of the output clock signal at a further early timing, and it is possible to reflect the fluctuations in frequency of the output clock signal onto the delay unit at a high speed. That is, in comparison with the case of the background art in which fluctuations in frequency of the output clock signal are fed back, influence of the delay time can be reduced.

Accordingly, by utilizing the clock generating circuit according to the invention for the above-described synchronous interface in which accuracy of the phase difference of the respective clock signals is requested, it is possible to further securely carry out data transmission.

Also, according to the invention, it is possible to compose the delay unit with simplified circuits for adjusting the delay time in compliance with a phase difference modulation signal based on a phase difference signal. For this reason, in comparison with a case where a fluctuation of the cycle of the output clock signal is detected, it is possible to compose the clock generating circuit of small-sized circuits.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 11 is a circuit block diagram depicting a prior art.

DETAILED DESCRIPTION OF THE PREFERRED EMBODIMENTS

Hereinafter, a detailed description is given of an embodiment that is one detailed example of a semiconductor apparatus according to implementation of the invention with reference to FIG. 1 through FIG. 10.

Figure 1:
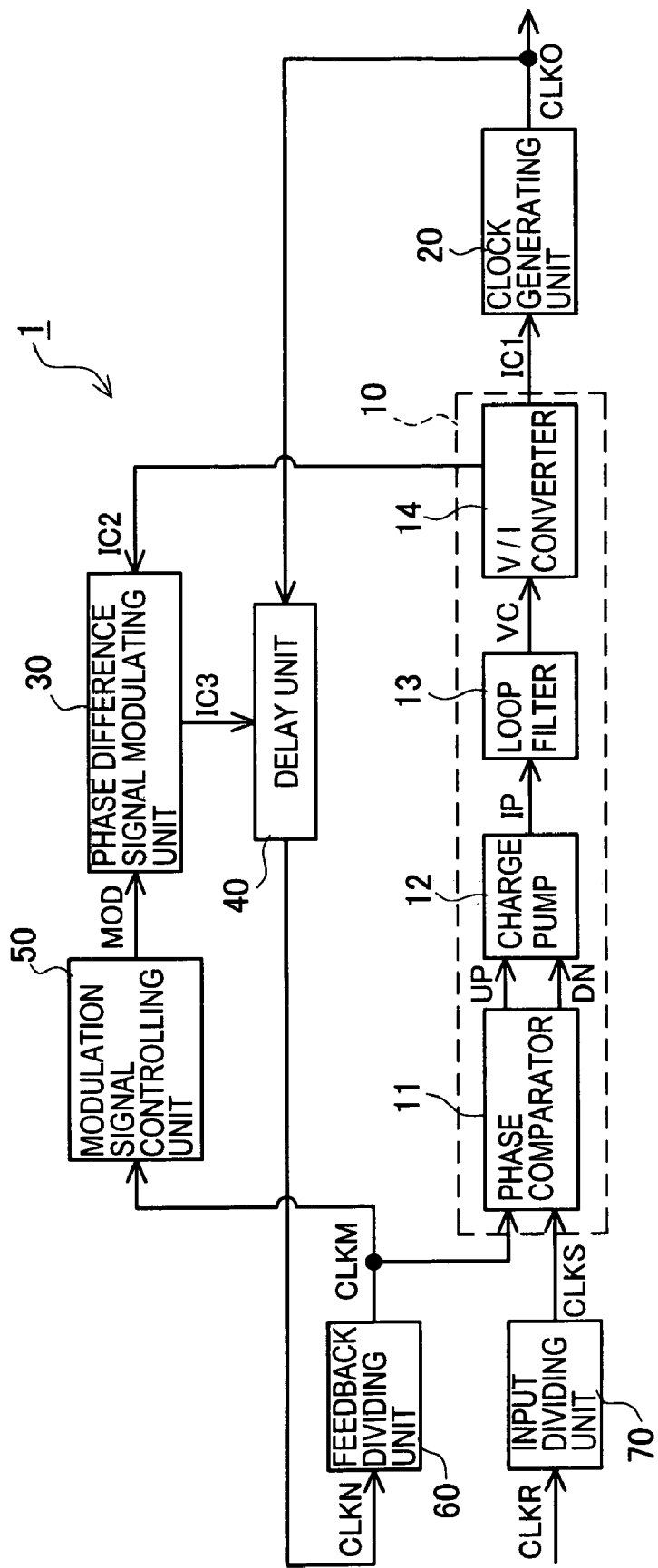
FIG. 1 is a circuit block diagram depicting a configuration of the present embodiment.

FIG. 1 is a circuit block diagram depicting an embodiment of a spectrum spread clock generating circuit 1. The spectrum spread clock generating circuit 1 includes a phase comparator unit 10, a clock generating unit 20, a phase difference signal modulating unit 30, a delay unit 40, a modulation signal control unit 50, a feedback dividing unit 60, and an input dividing unit 70. Of these, the feedback dividing unit 60 divides an internal clock signal CLKN into ten sections and outputs a divided internal clock signal CLKM.

Of these components, the phase comparator unit 10, clock generating unit 20, delay unit 40 and feedback dividing unit 60 compose a PLL (Phase Lock Loop) circuit, and the reference clock signal CLKS and divided internal clock signal CLKM are controlled so that the phase difference therebetween is made constant.

The phase comparator unit 10 includes a phase comparator 11, a charge pump 12, a loop filter 13, and a V/I converter 14.

The input dividing unit 70 divides the input clock signal CLKR into ten and outputs a reference clock signal CLKS.

The phase comparator 11 detects a time difference in a rise edge between the reference clock CLKS and a divided internal clock signal CLKM, and outputs phase difference signals UP and DN of a pulse width in response to the detection result. That is, where the rise edge of the divided internal clock signal CLKM becomes later than that of the reference clock signal CLKS, a phase difference signal UP is outputted at a pulse width in response to the time difference of the respective rise edges. Also, in the case contrary thereto, a phase difference signal DN is outputted at a pulse width in response to the time difference of the respective rise edges.

The charge pump 12 supplies a positive or a negative phase difference current IP to the loop filter 13 in response to the phase difference signal UP or DN. That is, where the phase difference signal UP is inputted, a positive current is supplied, and where the phase difference signal DN is inputted, a negative current is supplied.

The loop filter 13 integrates the phase difference current IP outputted by the charge pump 12 and outputs a control voltage VC.

The V/I converter 14 outputs control currents IC1 and IC2 in response to the control voltage VC. Also, the values of these control currents IC1 and IC2 are made into the same value in either case.

The clock generating unit 20 generates an output clock signal CLKO of a frequency in response to the control current IC1 from the V/I converter 14.

Figure 2:
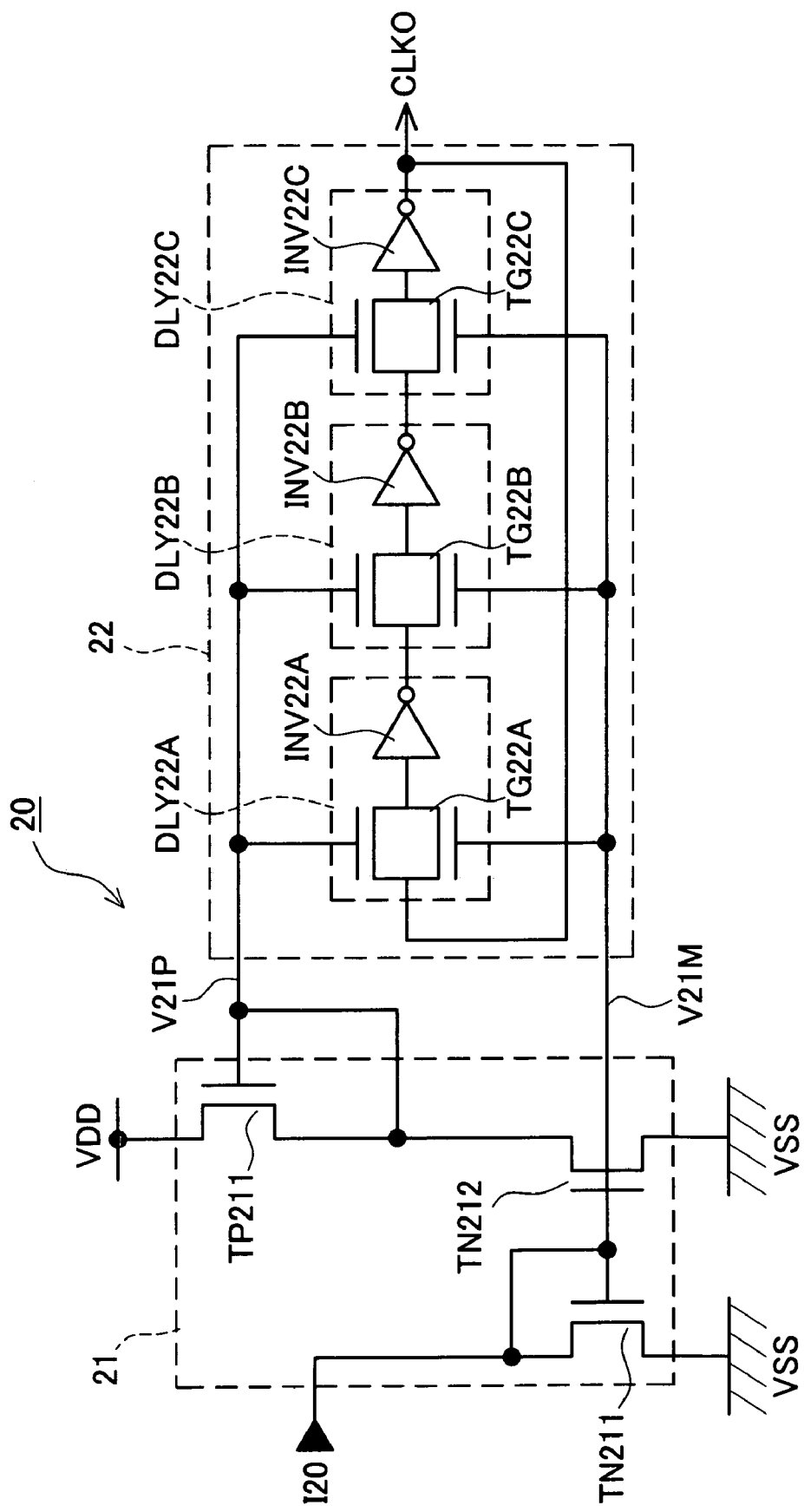
FIG. 2 is a circuit diagram depicting a detailed example of a clock generating unit.

FIG. 2 is a circuit diagram of the clock generating unit 20. The clock generating unit 20 includes the first bias voltage generating unit 21 and a ring oscillator unit 22.

The first bias voltage generating unit 21 is provided with N-type transistors TN211 and TN212 and a P-type transistor TP211. The N-type transistor TN211 has its drain electrode connected to the control current IC1 and the gate electrode and has its source electrode connected to the grounding potential. Also, the N-type transistor NT212 has its gate electrode connected to the gate electrode of the N-type transistor TN211, has its source electrode connected to the grounding potential, and has its drain electrode connected to the drain electrode of the P-type transistor. In addition, the drain electrode and the gate electrode of the P-type transistor TP211 are connected to each other, the source electrode is connected to the power source potential.

Further, the N-type transistors TN211 and TN212 compose a current mirror circuit, and a current flowing into the N-type transistor TN211, that is, a current having the same size as the control current IC1 will flow into the N-type transistor TN212 and the P-type transistor TP211.

Also, the N-type transistor TN211 and the P-type transistor TP211 are devised so that the absolute values of the drain voltages generated with respect to the drain current are made roughly equivalent to each other therein With the above-described current mirror circuit, drain voltages whose absolute values are roughly equivalent to each other are generated in the N-type transistor TN211 and the P-type transistor TP211.

Therefore, the first bias voltages V21M and V21P outputted by the first bias voltage generating unit 21 are as follows: That is, where the drain voltage of the N-type transistor TN211 is VB1 [V], the first bias voltage V21M=VB1 [V], and V21P=Power source voltage VDD−VB1 [V].

Furthermore, the ring oscillator unit 22 includes the first delay elements DLY22A through DLY22C. In the ring oscillator unit 22, the output of the first delay element DLY22A is connected to the input of the first delay element DLY22B, the output of the first delay element DLY22B is connected to the input of the first delay element DLY22C, and the output of the first delay element DLY22C is connected to the input of the first delay element DLY22A, and is connected to the periphery as an output clock signal CLKO. Thus, since the ring oscillator is composed of the first delay elements DLY22A through DLY22C, a clock signal in which the delay time from the first delay element DLY22A to the first delay element DLY22C is made into the half-cycle time is outputted to the output clock signal CLKO.

Also, the first delay element DLY22A includes a transfer gate TG22A and an inverter INV22A having the output of the transfer gate TG22A connected to the input thereof. The first delay elements DLY22B and DLY22C are composed as in the first delay element DLY22A, which include the transfer gates TG22B and TG22C and inverters INV22B and INV22C.

In addition, in any one of the respective transfer gates TG22A through TG22C, the first bias voltage V21M is applied to one gate electrode and the first bias voltage V21P is applied to the other gate electrode.

With the above-described composition, in the clock generating unit 20, the voltage values of the first bias voltages V21M and V21P are determined in response to the current value of the control current IC1. Further, the delay times of the transfer gates TG22A through TG22C are determined. That is, the cycle and frequency of the output clock signal CLKO are determined in compliance with the current value of the control current IC1.

Figure 3:
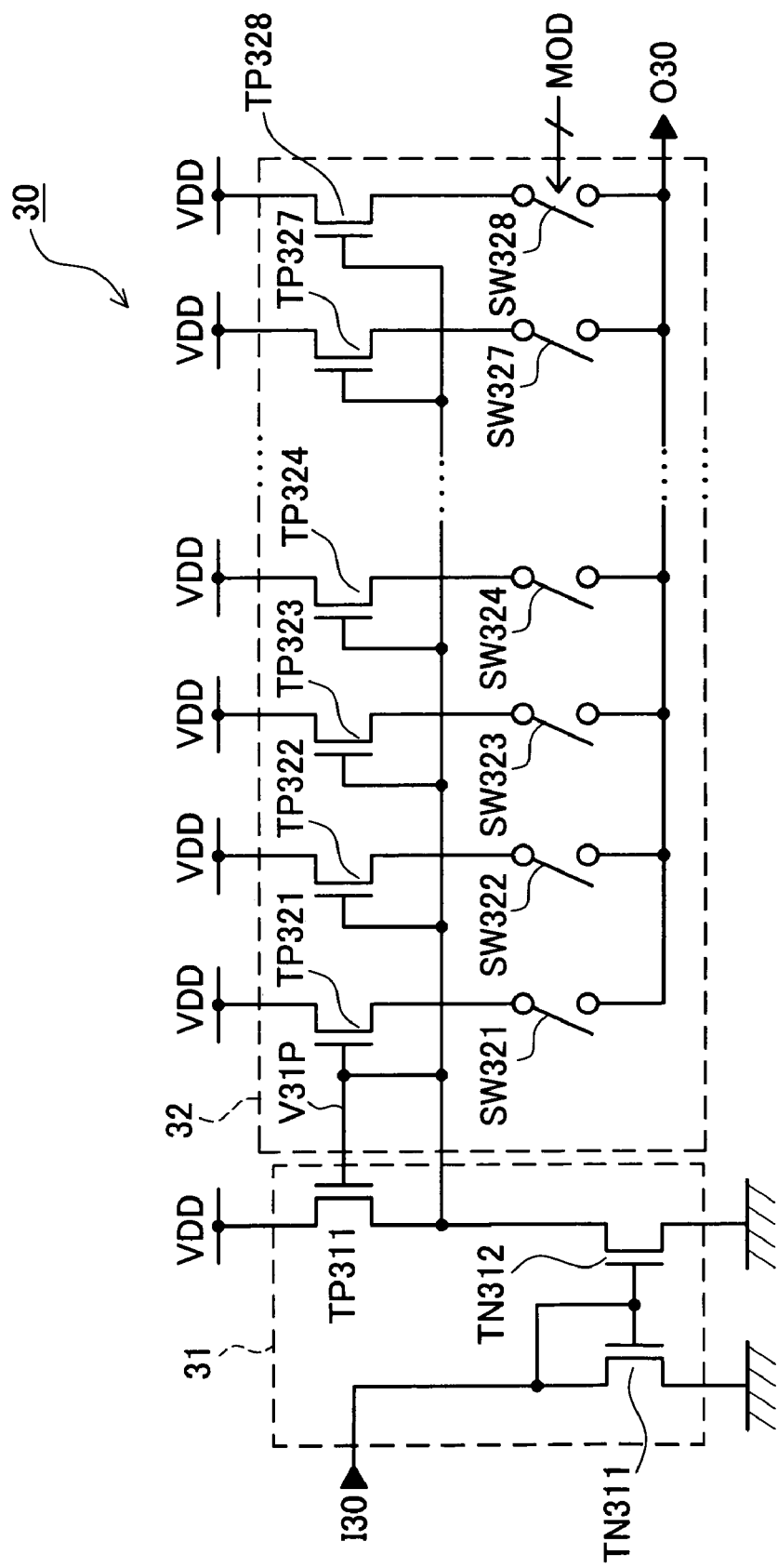
FIG. 3 is a circuit diagram depicting a detailed example of a phase difference signal modulating unit.

FIG. 3 is a circuit diagram depicting a circuit configuration of a phase difference signal modulating unit 30. The phase difference signal modulating unit 30 includes the second bias voltage generating unit 31 and the current output unit 32. Of these, the second bias voltage generating unit 31 includes N-type transistors TN311, TN312 and a P-type transistor TP311, and the current mirror circuit is composed as in the first bias voltage generating unit 21. For this reason, since a drain current having the same value as that of the control current IC2 flowing into the N-type transistor TN311 is caused to flow in the P-type transistor TP311, the second bias voltage VB2 in response to the drain current is outputted from the drain electrode. Also, in the first bias voltage generating unit 21 and the second bias voltage generating unit 31, the sizes of the transistors of the respective corresponding units are made equivalent to each other.

The current output unit 32 includes P-type transistors TP321 through TP327 and switches SW321 through SW327. In the P-type transistors TP321 through TP327, the respective gate electrodes are connected to the drain electrode of the P-type transistor TP311, and the second bias voltage VB2 is applied to the respective gate electrodes thereof. Also, in the P-type transistor TP321, the source electrode is connected to the power source voltage VDD, and the drain electrode is connected to the output terminal O30 via the switch SW321. Further, the P-type transistors TP322 through TP327 and switches SW322 through SW327 are connected as in the P-type transistor TP321 and switch SW321 described above. That is, the respective source electrodes are connected to the power source voltage VDD, and the respective drain electrodes are connected to the output terminal O30 via any one of the switches SW322 through SW327. In the present embodiment, as for the switches SW321 through SW327, respective continuity control is exclusively carried out in compliance with the modulation signal MOD.

Next, a description is given of the relationship between the control current IC2 to be inputted and the control current IC3 to be outputted with respect to the phase difference signal modulating unit 30. As described later, when the phase difference signal modulating unit 30 is connected to the delay unit 40 (Refer to FIG. 4), the output terminal O30 is connected to the grounding potential GND via the N-type transistor TN411 of the third bias voltage generating unit 41 of the delay unit 40.

Herein, for description, it is assumed that only the switch SW321 is in continuity. In this case, the drain current of the P-type transistor TP321 is caused to flow to the grounding potential GND via the output terminal O30. With respect to the P-type transistor TP321 and the P-type transistor TP311, since the second bias voltage VB2 is applied to the respective gate electrodes, the current ratios of the respective drain currents become equal to the respective transistor size ratios. That is, the current value of the control current IC3 outputted in this case is entered into the relationship of the control current IC2×(Transistor size of the P-type transistor TP321/Transistor size of the P-type transistor TP311).

Also, in the embodiment, where the transistor size of the P-type transistor TP311 is made into 1, the ratios of the transistor sizes of the P-type transistors TP321 through TP327 will be set as follows;

Transistor size ratio of P-type transistor TP321 =1
Transistor size ratio of P-type transistor TP322 =20/19
Transistor size ratio of P-type transistor TP323 =20/17
Transistor size ratio of P-type transistor TP324 =20/14
Transistor size ratio of P-type transistor TP325 =2
Transistor size ratio of P-type transistor TP326 =3
Transistor size ratio of P-type transistor TP327 =4
Transistor size ratio of P-type transistor TP328 =5

Also, the modulation value MOD will take a value in the range from 1 to 7. First, in a case of the modulation signal MOD=1, the switch SW321 is entered into continuity, in a case of the modulation signal MOD=2, the switch SW322 is entered into continuity. Hereinafter, as in the above, in cases of the modulation signal MOD=3 through 7, the switches SW323 through SW327 are, respectively, entered into continuity. Therefore, in cases of the modulation signals MOD=1 through 8, the current value of the control current IC3 will take values of control current IC2, control current IC2×20/19, control current IC2×20/17, control current IC2×20/14, control current IC2×2, control current IC2×3, control current IC2×4, and control current IC2×5.

As described above, the phase difference signal modulating unit 30 modulates the control current IC2 in compliance with the modulation signal MOD and outputs the control current IC3.

Further, in the embodiment, an example of exclusive switch continuity control is described. However, it is possible to carry out control in which a plurality of switches are simultaneously entered into continuity. In this case, the total value of all the drain currents flown from the P-type transistors connected to switches entered into continuity becomes the current value of the control current IC3. For example, if any one of the transistor ratios of the P-type transistors is set to 1, it is possible to change the current value of the control current IC3 to one time, two times, three times and four times. Also, the transistor ratios of the P-type transistors may be binarily weighted. In this case, it is possible to set the control current IC3 in a further wide range.

Figure 4:
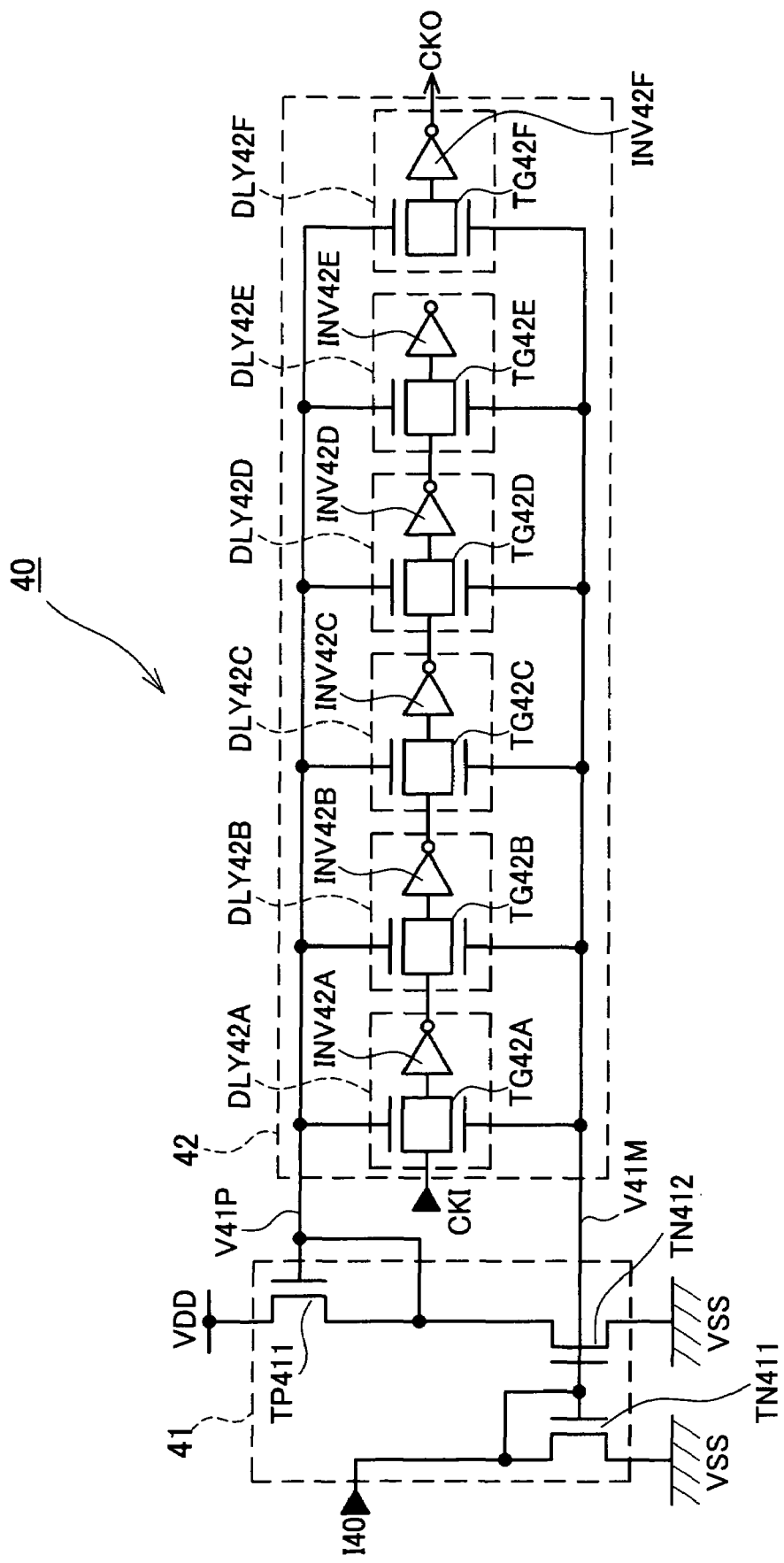
FIG. 4 is a circuit diagram depicting a detailed example of a delay unit.

FIG. 4 is a circuit diagram depicting a configuration of the delay unit 40. The output clock signal CLKO is delayed in compliance with the control current IC3, and the internal clock signal CLKN is outputted by the delay unit 40. And the delay unit 40 includes the third bias voltage generating unit 41 and a delay generating unit 42. Of these, the third bias voltage generating unit 41 includes the N-type transistors TN411, TN412 and P-type transistor TP411, and it composes the current mirror circuit as in the first bias voltage generating unit 21. Therefore, a drain current of the same value as the control current flowing into the N-type transistor TN411 is caused to flow into the P-type transistor TP411, wherein the third bias voltage VB3 is outputted from the drain electrode in compliance with the drain current. Also, in the first bias voltage generating unit 21 and the third bias voltage generating unit 41, the transistors of respective parts corresponding to each other are composed of the same element.

In addition, the delay generating unit 42 includes six sets of the second delay elements DLY42A through DLY42F. The second delay elements DLY42A through DLY42F are connected in series and are inserted between the input terminal CKI and the output terminal CKO. The delay element DLY42A, which is one of these delay elements, includes a transfer gate TG42A and an inverter INV42A connected to the transfer gate TG42A. Also, the other second delay elements DLY42B through DLY42F also include transfer gates TG42B through TG42F and inverters INV42B through INV42F, and are connected as in the second delay element DLY42A.

Further, in any one of the respective transfer gates TG42A through TG42F, the third bias voltage V41M is applied to one gate electrode, and the third bias voltage V41P is applied to the other gate electrode.

With the above-described construction, in the delay unit 40, the voltage values of the third bias voltages V41M and V41P are determined in compliance with the current value of the control current IC3. Further, the delay time of the transfer gates TG42A through TG42F is determined.

In this connection, it is assumed that the current value of the control current IC3 changes in an increasing direction. In this case, the third bias voltage V41M changes in the direction of the grounding potential GND, and the third bias voltage V41P changes in the direction of the power source voltage VDD. And, the transfer gates TG42A through TG42F linearly changes in the direction along which the impedance decreases. The delay time is reduced. Therefore, in inverse prounit to the control current IC3, the delay time of the delay unit 40 changes without any step.

Also, as in the clock generating circuit according to Japanese Unexamined Patent Publication No. 2005-20083, in a case where one of a plurality of delay clock signals is selectively switched and the delay clock signal is changed, for example, if switching is caused to occur at an intermediate timing between the timing on which a change edge of the delay clock signal before switching occurs and the timing on which a change edge of the delay clock signal after switching occurs, the respective change edges will be outputted. That is, there is a risk that a hazard occurs before and after the switching.

In the spectrum spread clock generating circuit 1 according to the embodiment, the delay time of the delay unit 40 changes without any step. Therefore, it is possible to generate clock signals having high reliability, for which no hazard is allowed to occur when changing the delay clock signals.

Also, the transfer gates TG42A through TG42F and the transfer gates TG22A through TG22C of the clock generating unit 20 are composed of elements equivalent to each other. Also, the inverters INV42A through INV42C and the inverters INV22A through INV22C of the clock generating unit 20 are composed of elements equivalent to each other. Therefore, in the phase difference signal modulating unit 30, in a case where the control current IC3 is outputted at the same current value as that of the control current IC2, the first delay elements DLY22A through DLY22C and the second delay elements DLY42A through DLY42F will respectively have the same delay time. Further, since the ratio in quantities of the second delay elements DLY42A through DLY42F and the first delay elements DLY22A through DLY22C is made into 2 to 1, the delay time of the delay unit 40 will become two times the half-cycle of the output clock signal CLKO, that is, the time of a length equivalent to one cycle of the output clock signal CLKO.

Figure 6:
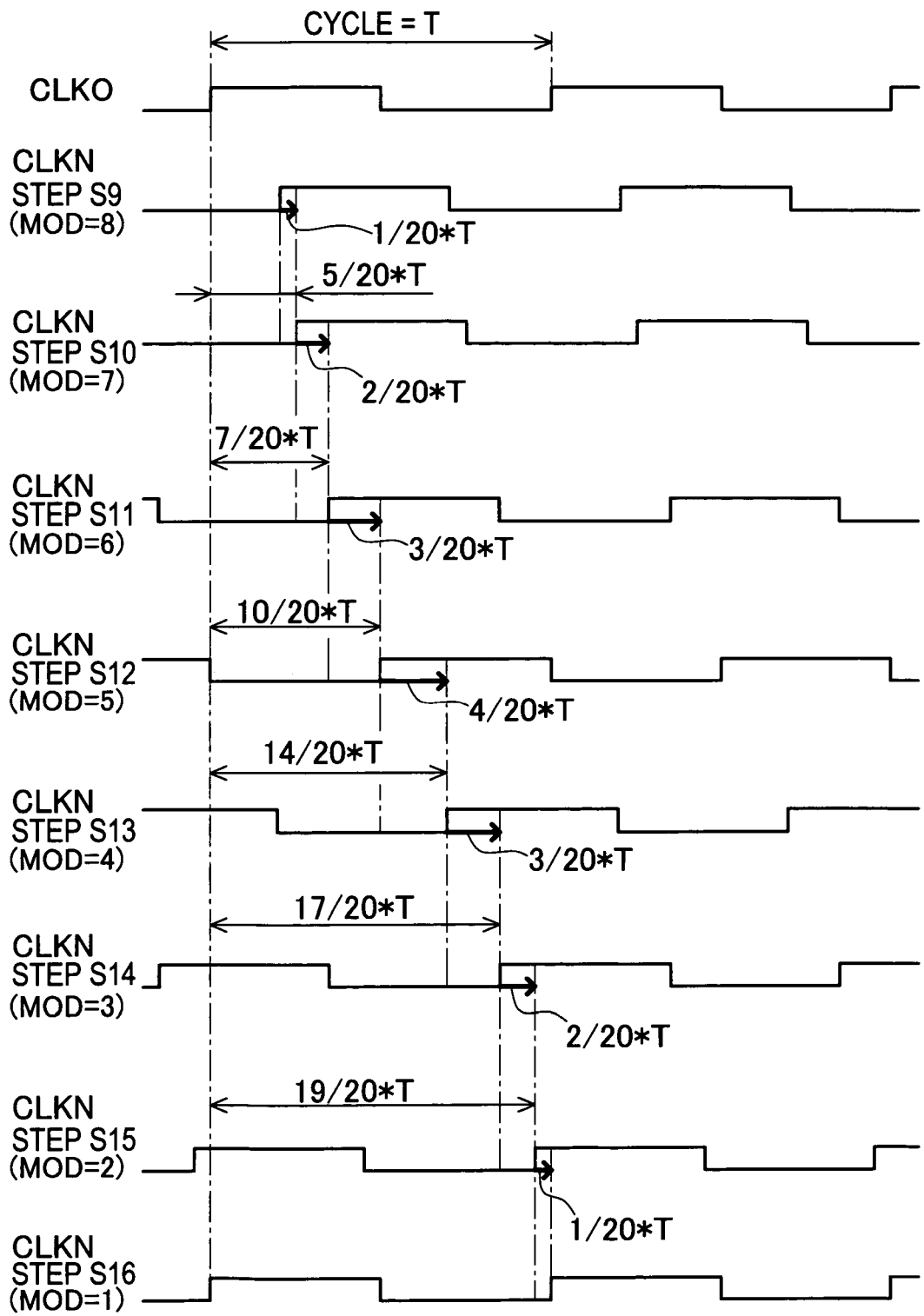
FIG. 6 is a waveform diagram depicting the relationship between CLKO and CLKN in Steps S9 through S16.
Figure 7:
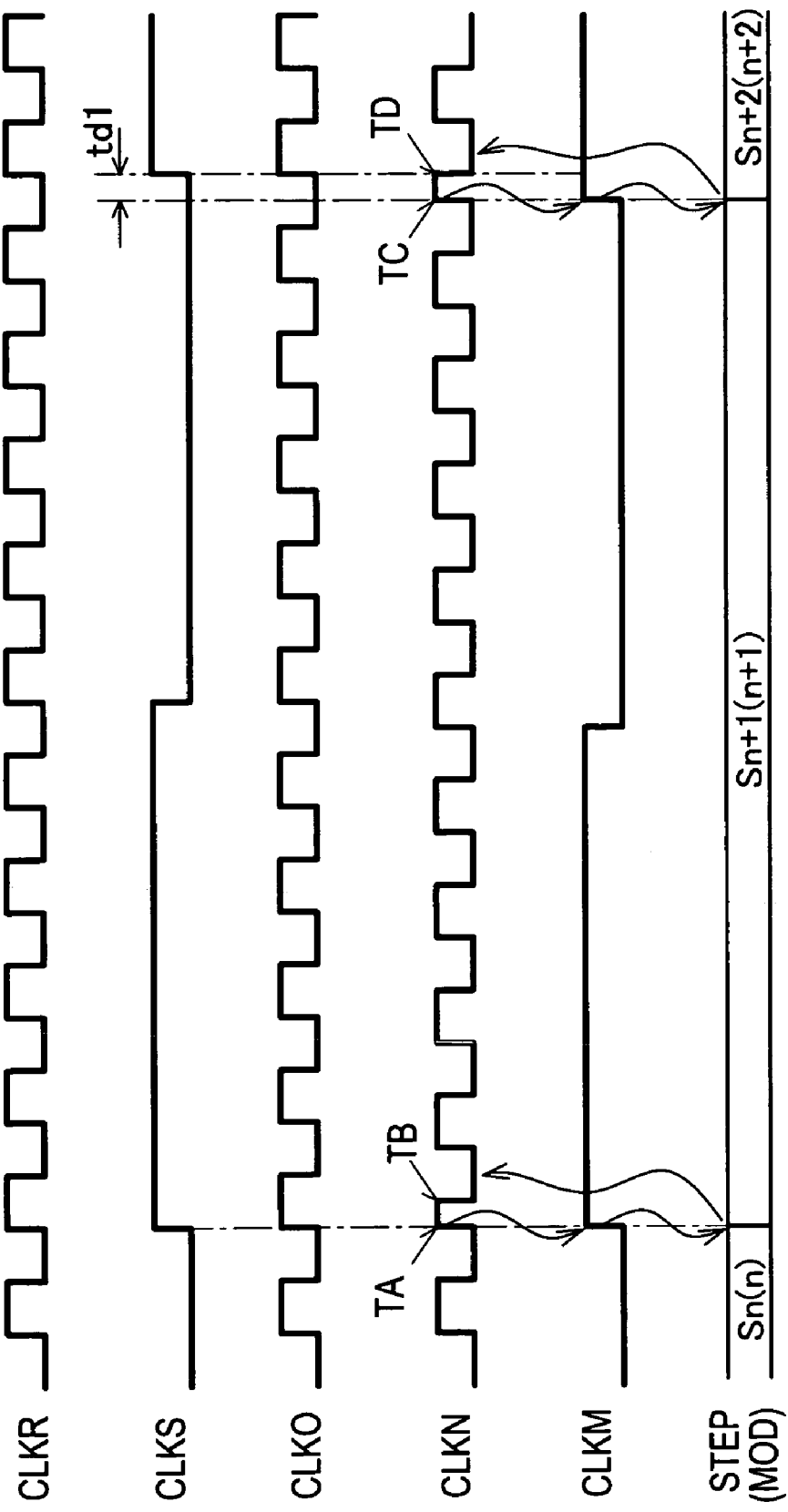
FIG. 7 is a waveform diagram depicting control actions in Steps S1 through S8.
Figure 8:
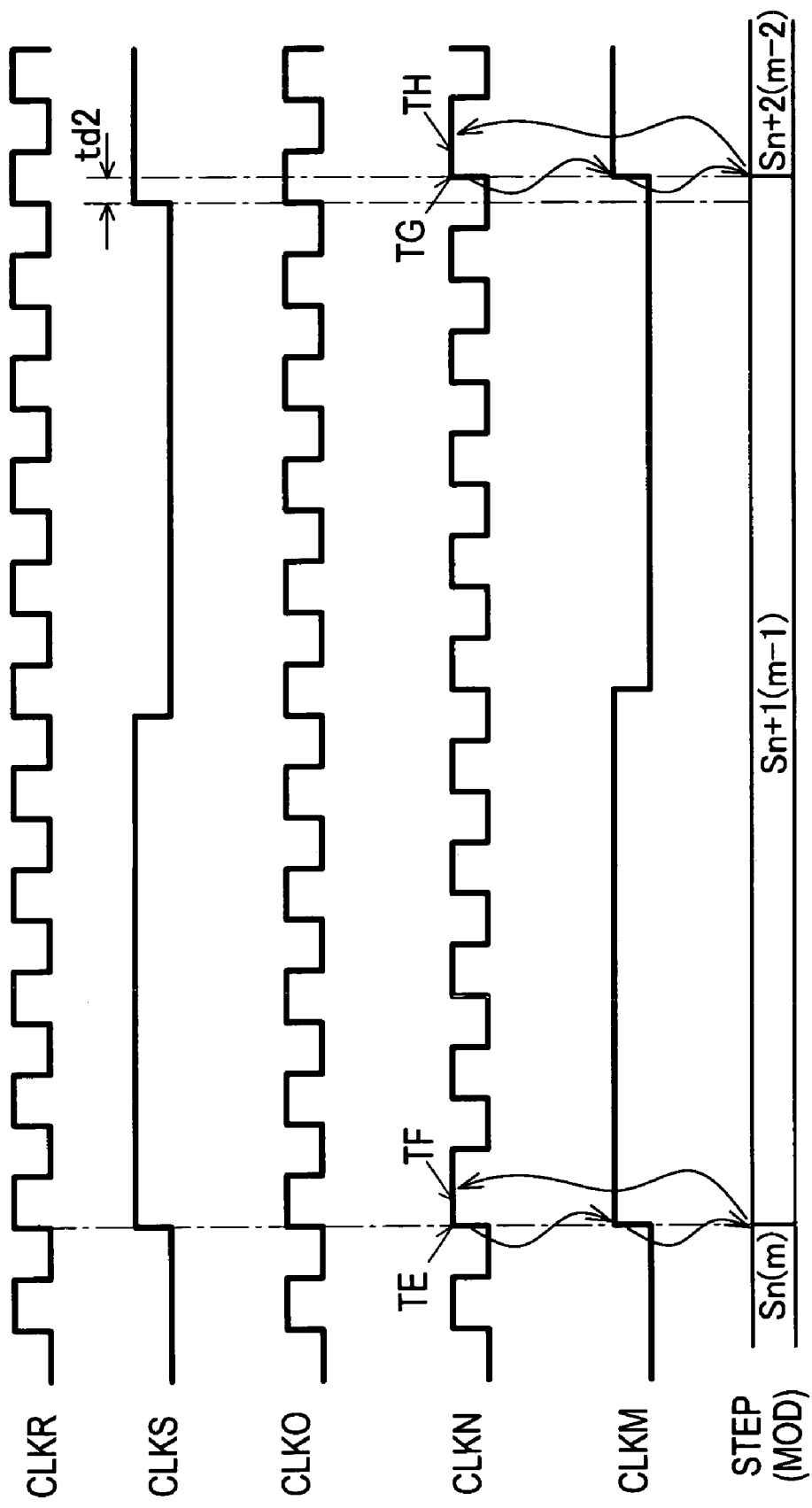
FIG. 8 is a waveform diagram depicting control actions in Steps S9 through S16.

The modulation signal controlling unit 50 includes Steps S1 through S16 and outputs modulation signals MOD at a timing in response to the divided internal clock signals CLKM (Refer to FIG. 7 and FIG. 8). Of these, in Steps S1 through S8, 1 through 8 are outputted in the order (the ascending order) as values of the modulation signals MOD (Refer to FIG. 5). Also, in Steps S9 through S16, 8 through 1 are outputted in the order (the descending order) as the values of the modulation signals MOD (Refer to FIG. 6).

Also, in the spectrum spread clock generating circuit 1 according to the embodiment, the output clock signal CLKO is delayed on the basis of the control current IC2. Therefore, in comparison with a case where a fluctuation of the cycle T of the output clock signal CLKO is detected, it is possible to detect the fluctuation of the cycle T of the output clock signal at an early timing, and response to the delay unit 40 to the fluctuation in frequency of the output clock signal CLKO can be carried out at a high speed. That is, in comparison with the background art of feeding back the fluctuation in frequency of the output clock signal CLKO, influence of the delay time can be reduced.

For this reason, by utilizing the spectrum spread clock generating circuit 1 to a synchronous interface for which accuracy in phase difference of the respective clock signals is requested, it is possible to further securely carry out data transmission.

In addition, in the spectrum spread clock generating circuit 1, it is possible to compose the delay unit 40 of simplified circuits for adjusting the delay time in compliance with the control current IC3 based on the control current IC2. Therefore, in comparison with the background art for feeding back a fluctuation in frequency of the output clock signal CLKO, it is possible to compose the delay unit of further small-sized circuits.

Further, in the spectrum spread clock generating circuit 1 according to the embodiment, the clock generating unit 20 and the delay unit 40 include the same delay element in either case. Accordingly, even in a case where a phase difference signal, environment such as the ambient temperature, and other environments such as process conditions change, since these change with the same characteristics, it is possible to keep the relationship constant between the delay time of the delay unit 40 and the cycle T of the output clock signal CLKO.

Also, the spectrum spread clock generating circuit 1 according to the embodiment utilizes the control currents IC1, IC2 and IC3, by which the intensity of the current changes, in connection with the phase difference signal and the phase difference modulating signal. Therefore, the transmission path of signals can be reduced to low impedance, wherein tolerance to voltage-related noise can be increased.

Further, in the spectrum spread clock generating circuit 1 according to the embodiment, the control current IC3 is outputted at a timing in response to the divided internal clock signal CLKM. For this reason, it is possible to generate timing, on which a modulation signal is outputted, with simplified circuits.

Next, a description is given of actions of the spectrum spread clock generating circuit 1 with reference to FIG. 5 through FIG. 10.

The spectrum spread clock generating circuit 1 changes the delay time of the delay unit 40 in Steps S1 through S16 and feeds it back to the PLL, and carries out spectrum spread to the output clock signal CLKO.

Figure 5:
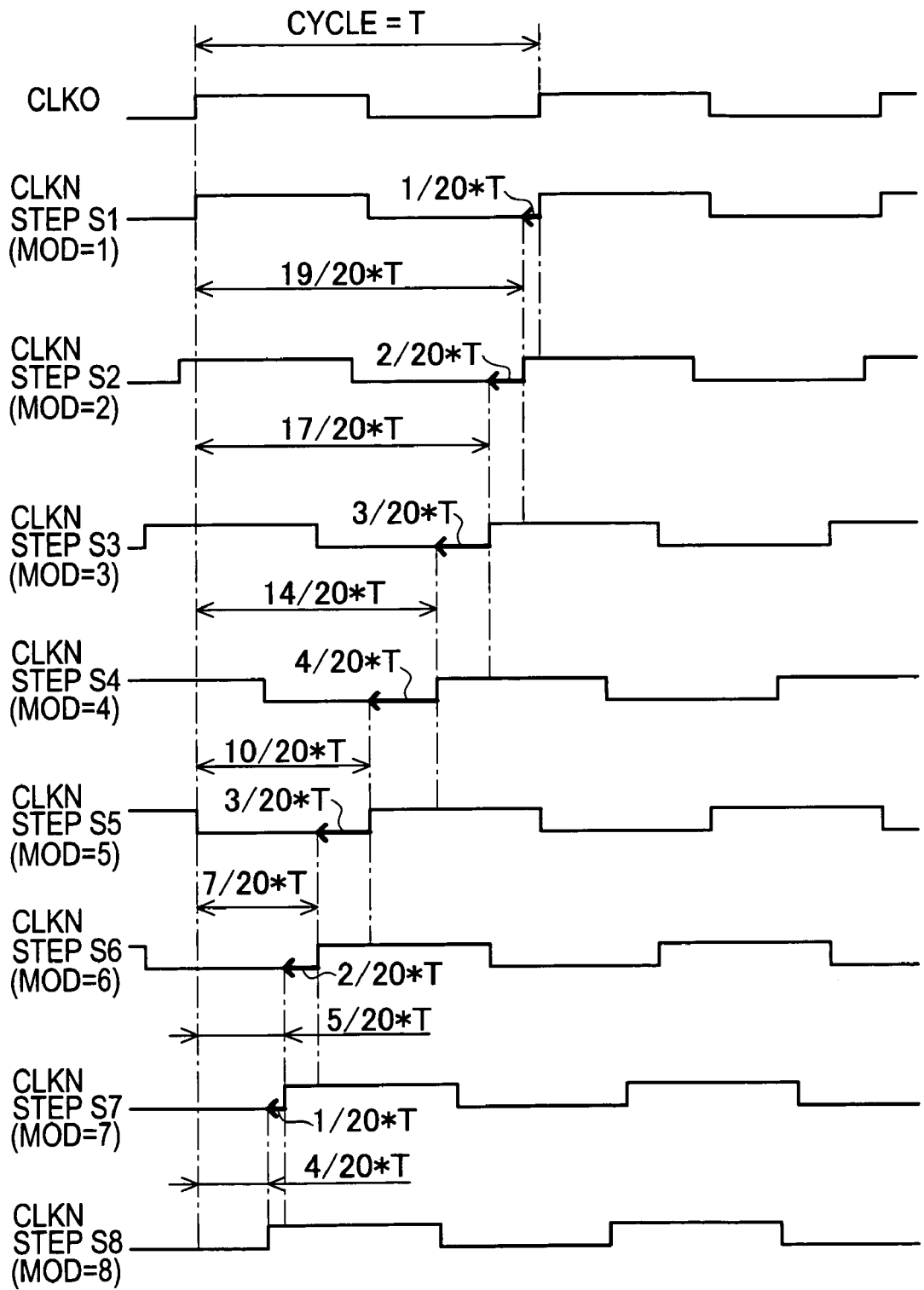
FIG. 5 is a waveform diagram depicting the relationship between CLKO and CLKN in Steps S1 through S8.

FIG. 5 is a waveform diagram depicting the relationship between the output clock signal CLKO and the internal clock signal CLKN in Steps S1 through S8. FIG. 6 is a waveform diagram depicting the relationship between the output clock signal CLKO and the internal clock signal CLKN in Steps S9 through S16.

First, in Step S1, a modulation signal MOD=1 is inputted into the phase difference signal modulating unit 30. As described above, in the case of the modulation signal MOD=1, the value of the control current IC3 outputted from the phase difference signal modulating unit 30 becomes the same value of the control current IC2. When the current of the same value as the control current CI2 is inputted into the delay unit 40, the delay time of the delay unit 40 is made into time of a length equivalent to the cycle T of the output clock signal CLKO. Therefore, the phase difference between the output clock CLKO and the internal clock signal CLKN becomes zero (0).

Next, in Step S2, a modulation signal MOD=2 is inputted into the phase difference signal modulating unit 30, and the value of the control current IC3 becomes the control current IC2×20/19, and the delay time of the delay unit 40 changes in an inverse prounit to the control current IC3. Accordingly, the delay time becomes 19/20×cycle T.

Hereinafter, in Steps S3 through S16, as in Step S2, the control current IC2 is modulated in compliance with the modulation signal MOD, and the control current IC3 is outputted, wherein the delay value of the delay unit 40 is varied, as depicted in FIG. 5 and FIG. 6, in compliance with the control current IC3.

Next, referring to FIG. 7 and FIG. 8, a description is given of control actions in the respective Steps.

FIG. 7 is a waveform diagram depicting control actions of the input clock signal CLKR, reference clock signal CLKS, output clock signal CLKO, internal clock signal CLKN, divided internal clock signal CLKM and step actions. Of these, the reference clock signal CLKS is a signal obtained by dividing the input clock signal CLKR into ten sections, and the internal clock signal CLKN is a signal obtained by delaying the output clock signal CLKO by the delay unit 40, and the divided internal clock signal CLKM is a signal obtained by dividing the internal clock signal CLKN into ten sections. Also, the respective Steps are switched at a timing in response to the divided internal clock signal CLKM.

Here, Step Sn is expressed to mean Step S1 through S8 which are generalized (n=1 through 8). For example, when n=1, it means Step S1. Also, figures in the brackets mean values that the modulation signal MOD acquires.

First, at timing TA, when the internal clock signal CLKN is changed from LOW level to HIGH level, the divided internal clock signal CLKM is changed from LOW level to HIGH level. The process shifts from Step Sn to Step Sn+1. Further, since the value of the modulation signal MOD is renewed from n to n+1, the delay time of the delay unit 40 changes in a direction along which the value decreases, that is, in a direction along which the phase of the internal clock signal CLKN advances.

At timing TB, the delay time of the delay unit 40 is varied by the control current IC3 modulated by the modulation signal MOD. Therefore, the phase of the internal clock signal CLKN changes in a direction along which it advances. However, at this moment, a change in phase of the internal clock signal CLKN is not reflected on the divided internal clock signal CLKM and the phase comparator unit 10.

At timing TC, the change in phase of the internal clock signal CLKN in its advancing direction is reflected on the divided internal clock signal CLKM, and finally the phase difference is detected by the phase comparator unit 10. By detecting the advance of the phase of the internal clock signal CLKN with reference to the reference clock signal CLKS, the frequency of the output clock signal is changed to the low frequency side. Also, since the divided internal clock signal CLKM is changed from LOW level to HIGH level, the process shifts from Step Sn+1 to Step Sn+2, wherein the value of the modulation signal MOD varies from n+1 to n+2. Further, at timing TD, as at timing TB, the delay time of the delay unit 40 is varied in compliance with the modulation signal MOD.

FIG. 8 is a waveform diagram depicting control actions of the input clock signal CLKR, reference clock signal CLKS, output clock signal CLKO, internal clock signal CLKN, divided internal clock signal CLKM and step actions in Step S9 through S16. The relationship between the respective clocks is similar to that in FIG. 7.

At timing TE, when the level of the internal clock signal CLKN is changed from LOW level to HIGH level, the divided internal clock signal CLKM is changed from LOW level to HIGH level, and the process shifts from Step Sn to Step Sn+1. Further, since the value of the modulation signal MOD is renewed from m to m−1, the delay time of the delay unit 40 changes in a direction along which it increases, that is, in a direction along which the phase in the internal clock signal CLKN is delayed.

At timing TF, the delay time of the delay unit 40 changes by the control current IC3 modulated by the modulation signal MOD, whereby the phase of the internal clock signal CLKN is changed in a direction along which it is delayed. However, at this moment, a change in the phase of the internal clock signal CLKN is not reflected on the divided internal clock signal CLKM and the phase comparator unit 10.

At timing TG, a change in phase of the internal clock signal CLKN in its delaying direction is reflected on the divided internal clock signal CLKM. Finally, the phase difference is detected by the phase comparator unit 10. By detecting a delay in the phase of the internal clock signal CLKN with respect to the reference clock signal CLKS, the frequency of the output clock signal CLKO changes in the high frequency side. In addition, since the divided internal clock signal CLKM is changed from LOW level to HIGH level, the process shifts from Step Sn+1 to Step Sn+2, wherein the value of the modulation signal MOD changes from m−1 to m−2. Further, at timing TD, as in the case of timing TB, the delay time of the delay unit 40 is changed in compliance with the modulation signal MOD.

Figure 9:
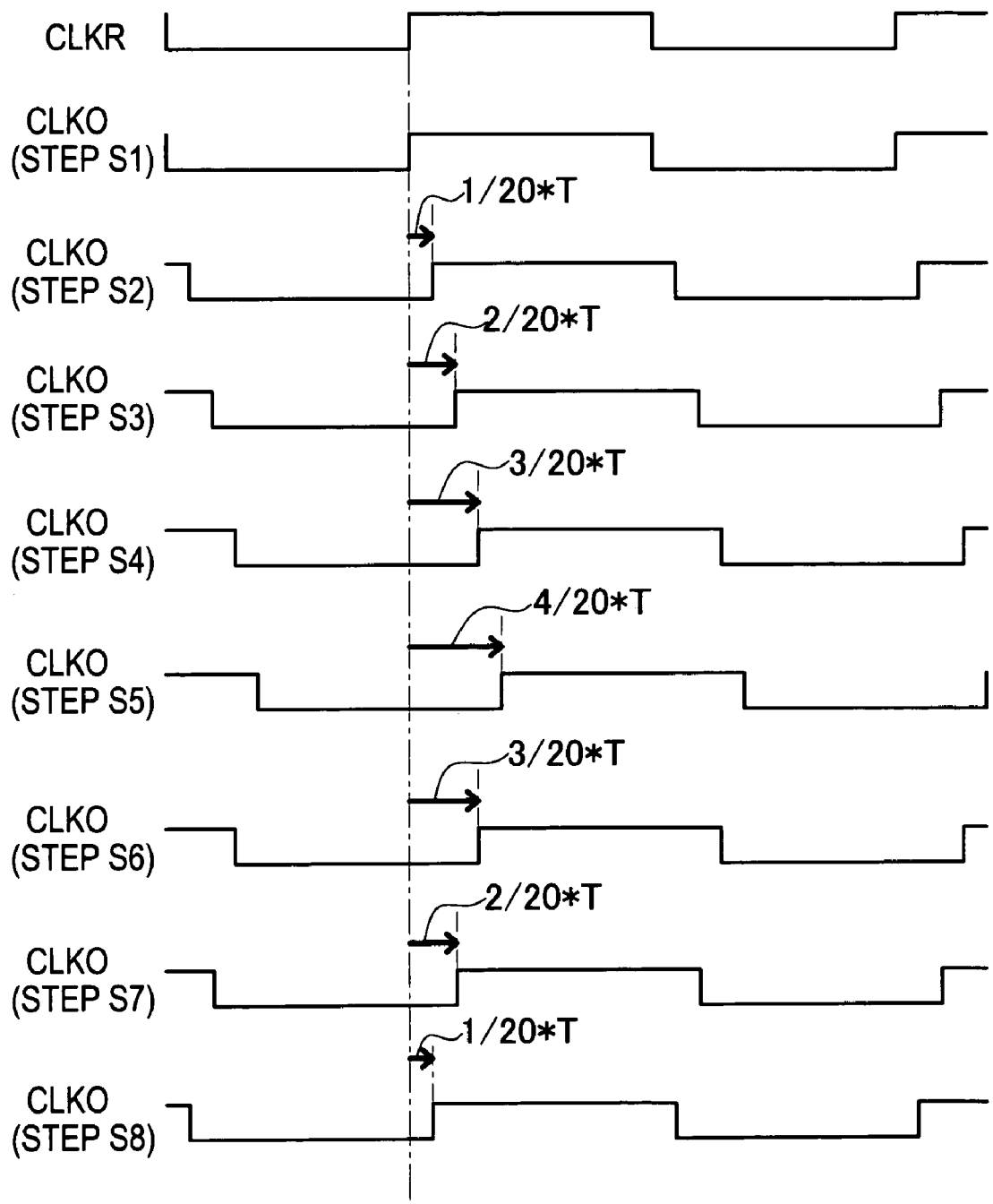
FIG. 9 is a waveform diagram depicting the relationship between CLKR and CLKO in Steps S1 through S8.
Figure 10:
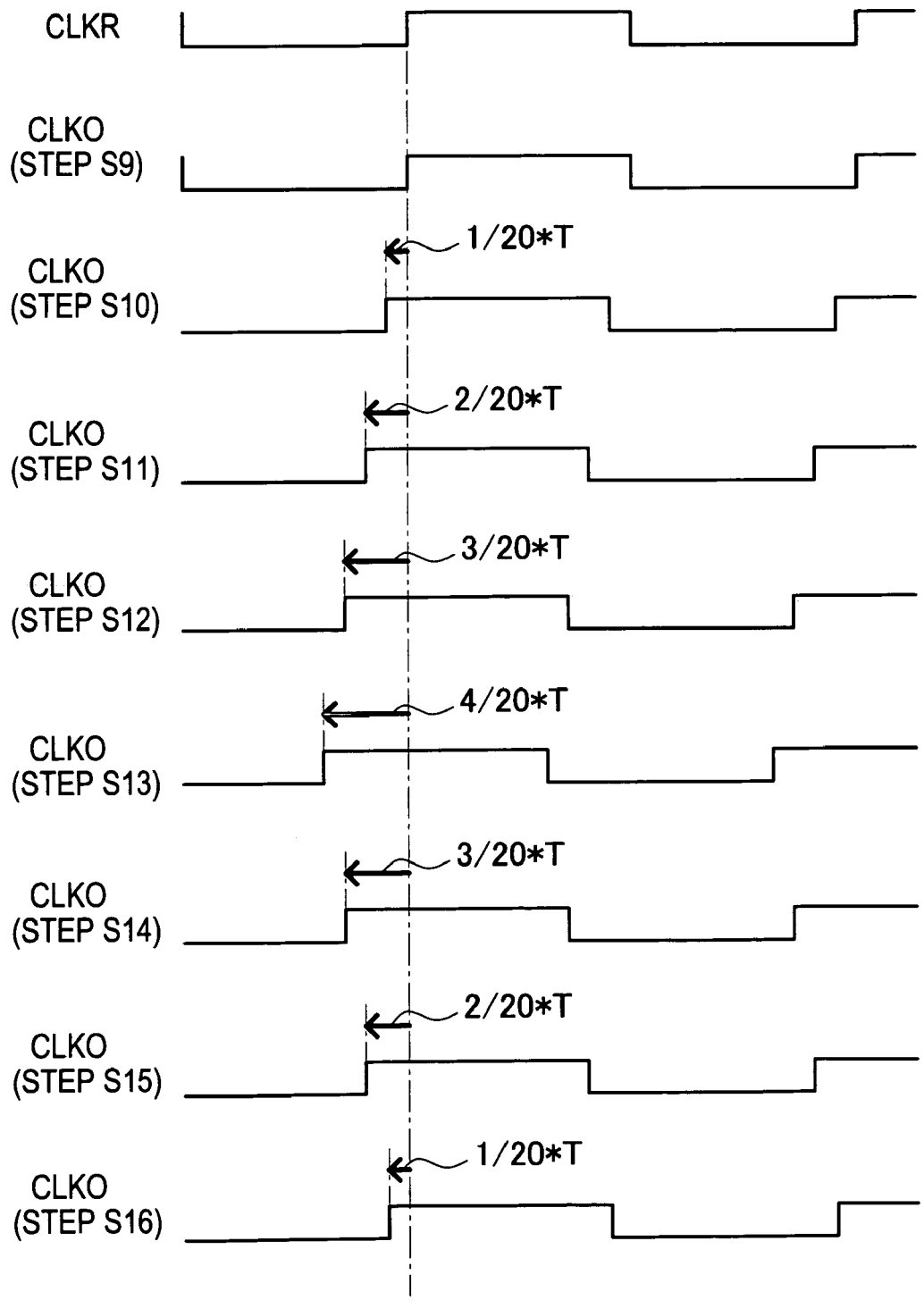
FIG. 10 is a waveform diagram depicting the relationship between CLKR and CLKO in Steps S9 through S16.

FIG. 8 and FIG. 9 are waveform diagrams depicting the relationship between the input clock signal CLKR and the output clock signal CLKO. With respect to the input clock signal CLKR, the frequency of the output clock signal CLKO is adjusted by the PLL circuit in a direction along which the phase difference becomes zero (0). Therefore, the amount of fluctuation in the delay time of the delay unit 40, which changes step by step, is reflected on the oscillation frequency of the clock generating unit 20.

For example, in a case of shifting from Step S1 to Step S2, since the amount of fluctuation in the delay time is 1/20× cycle T, the phase difference between the input clock signal CLKR and the output clock signal CLKO becomes 1/20× cycle T as depicted in FIG. 5. As for Step S3 to Step S16, as depicted in FIG. 8 and FIG. 9, the relationship between the input clock signal CLKR and the output clock signal CLKO is made into a relationship equivalent to the case of shifting from Step S1 to Step S2.

In the spectrum spread clock generating circuit 1 according to the embodiment, in the case of the modulation signal MOD=1, the delay unit 40 generates delay time of cycle T of the output clock signal CLKO. Also, in the phase difference signal modulating unit 30, this case brings about the maximum value of the delay time. For this reason, the delay time of the delay unit 40 does not exceed the cycle T of the output clock signal CLKO. In addition, the amount of fluctuation in the delay time does not exceed the cycle T of the output clock signal CLKO. Therefore, such a spectrum spread clock generating circuit 1 can be obtained, in which the phase difference between the input clock signal CLKR and the output clock signal CLKO operates within the range of the cycle T of the output clock signal CLKO.

Further, in the embodiment, the spectrum spread clock generating circuit 1 is expressed as one example of the clock generating circuit, the control current IC1 and control current IC2 are expressed as one example of the phase difference signal, and the control current IC3 is expressed as one example of the phase difference modulating signal, respectively.

In addition, the invention is not limited to the present embodiment. It is obvious that the invention can be subjected to various improvements and modifications within the range not departing from the spirit of the invention.

Also, although, in the embodiment, a spectrum spread clock generating circuit composed of MOS transistor elements is disclosed, other semiconductor elements such as bipolar transistor elements, gallium arsenic elements, etc., may be used as long as the semiconductor elements can function as in the MOS transistors.

Also, although, in the embodiment, the control currents IC1, IC2, and IC3 in which the intensity of current changes are made into phase difference signals and phase difference modulating signals, a phase difference signal and a phase difference modulating signal may be used, which use digital values as the value by utilizing an A/D converter and a D/A converter.

Utilizing the invention, a spectrum spread clock is generated, and it is possible to carry out high-speed and accurate phase control of the reference clock signals and output clock signals, and it is possible to provide a clock generating circuit composed of simplified circuits and a method for generating clocks.

What is claimed is:

1. A clock generating circuit which uses a reference clock as an input and carries out spectrum spread of an output clock in compliance with a modulating signal, comprising:
    a phase comparator unit for comparing a phase difference between the reference clock and an internal clock or a divided internal clock, and outputting a phase difference signal in response to the result of comparison;
    a clock generating unit for generating an output clock in response to the phase difference signal;
    a phase difference signal modulating unit for modulating the phase difference signal in compliance with the modulating signal, and for outputting a phase difference modulating signal; and
    a delay unit for delaying the output clock in compliance with the phase difference modulating signal; and for outputting the internal clock.

2. The clock generating circuit according to claim 1, wherein the delay unit varies the delay time without any step when delaying the output clock.

3. The clock generating circuit according to claim 1, wherein the delay unit includes a first delay element for generating delay time of the output clock signal, and the clock generating unit includes a second delay element for generating delay time equivalent to a half cycle of the output clock signal, and the first delay element and the second delay element are composed of elements of the same device structure.

4. The clock generating circuit according to claim 3, wherein the delay time of the delay unit has the time equivalent to one cycle of the clock signal as the maximum delay time, and is modulated so as not to exceed the maximum delay time in compliance with the phase difference modulating signal.

5. The clock generating circuit according to claim 3, wherein the second delay element is composed of one or a plurality of unit delay element(s), the first delay element is composed of the unit delay elements two times the second delay element, and the phase difference modulating signal is a bias signal of the first delay element, and is generated with the bias signal to the second delay element used as the maximum delay condition.

6. The clock generating circuit according to claim 5, wherein the unit delay element includes a transfer gate, and the bias voltage to the transfer gate is modulated based on the phase difference signal or the phase difference modulating signal.

7. The clock generating circuit according to claim 1, wherein the phase comparator unit outputs the phase difference signal whose current value changes, the clock generating unit generates the output clock in compliance with a current value of the inputted phase difference signal, the phase difference signal modulating unit outputs a phase difference modulating signal whose current value changes, and the delay unit has the delay time of the output clock varied in compliance with the current value of the inputted phase difference modulating signal.

8. The clock generating circuit according to claim 1, including a modulation control unit for outputting the modulation signal at a timing in response to the internal clock or the divided internal clock inputted into the phase comparator unit.

9. A clock generating method for carrying out spectrum spread of an output clock in compliance with a modulating signal using a reference clock as an input, comprising the steps of:
- comparing a phase difference between the reference clock and an internal clock or the divided internal clock, and outputting a phase difference signal in response to the result of comparison;
- generating an output clock in response to the phase difference signal;
- modulating the phase difference signal in compliance with the modulating signal, and outputting a phase difference modulating signal; and
- delaying the output clock in compliance with the phase difference modulating signal, and for outputting the internal clock.

10. The clock generating method according to claim 9, wherein, in the step of outputting the internal clock, the delay time changes without any step when delaying the output clock.

11. The clock generating method according to claim 9, wherein the delay time of the step of outputting the internal clock is modulated so as not to exceed the maximum delay time in compliance with the phase difference modulating signal with the same time as one cycle of the clock signal used as the maximum delay time.

12. The clock generating method according to claim 9, wherein the step of outputting the phase difference signal outputs the phase difference signal whose current value changes in compliance with the result of comparison;
- the step of generating the output clock generates the output clock in compliance with the current value of the inputted phase difference signal;
- the step of outputting the phase difference modulating signal outputs a phase difference modulating signal whose current value changes in compliance with the modulating signal; and
- the step of outputting the internal clock, the delay time of the output clock changes in compliance with the current value of the inputted phase difference modulating signal.

13. The clock generating method according to claim 9, including the step of outputting the modulation signal at a timing in response to the internal clock or the divided internal clock inputted in the step of outputting the phase difference signal.

* * * * *